US011018045B2

(12) United States Patent
Seo et al.

(10) Patent No.: US 11,018,045 B2
(45) Date of Patent: *May 25, 2021

(54) DEPOSITION APPARATUS INCLUDING UPPER SHOWER HEAD AND LOWER SHOWER HEAD

(71) Applicant: Samsung Electronics Co., Ltd., Suwon-si (KR)

(72) Inventors: Ji Youn Seo, Seoul (KR); Byung Sun Park, Suwon-si (KR); Sung Jin Park, Seongnam-si (KR); Ji Woon Im, Hwaseong-si (KR); Hyun Seok Lim, Suwon-si (KR); Byung Ho Chun, Seongnam-si (KR); Yu Seon Kang, Hwaseong-si (KR); Hyuk Ho Kwon, Hwaseong-si (KR); Tae Yong Eom, Anyang-si (KR); Dae Hun Choi, Hwaseong-si (KR); Dong Hyeop Ha, Daegu (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 192 days.

This patent is subject to a terminal disclaimer.

(21) Appl. No.: 15/993,752

(22) Filed: May 31, 2018

(65) Prior Publication Data

US 2019/0148211 A1 May 16, 2019

(30) Foreign Application Priority Data

Nov. 16, 2017 (KR) .................. 10-2017-0153018

(51) Int. Cl.
*H01L 21/687* (2006.01)
*C23C 14/50* (2006.01)
(Continued)

(52) U.S. Cl.
CPC ........ *H01L 21/68714* (2013.01); *C23C 14/50* (2013.01); *C23C 16/4583* (2013.01);
(Continued)

(58) Field of Classification Search
USPC ..................... 156/345.51, 345.34; 118/723 R
See application file for complete search history.

(56) References Cited

U.S. PATENT DOCUMENTS 5,304,248 A 4/1994 Cheng et al.
5,620,525 A 4/1997 Van de Ven
(Continued)

FOREIGN PATENT DOCUMENTS

CN 101448977 A 6/2009
CN 105316651 A 2/2016
(Continued)

OTHER PUBLICATIONS

U.S. Appl. No. 15/988,067, filed May 24, 2018, K. D. Sweely.
(Continued)

*Primary Examiner* — Yewebdar T Tadesse
(74) *Attorney, Agent, or Firm* — Lee IP Law. P.C.

(57) ABSTRACT

A deposition apparatus for depositing a material on a wafer, the apparatus including a lower shower head; an upper shower head disposed on the lower shower head, the upper shower head facing the lower shower head; and a support structure between the upper shower head and the lower shower head, the wafer being supportable by the support structure, wherein the upper shower head includes upper holes for providing an upper gas onto the wafer, the lower shower head includes lower holes for providing a lower gas onto the wafer, the support structure includes a ring body surrounding the wafer; a plurality of ring support shafts between the ring body and the lower shower head; and a plurality of wafer supports extending inwardly from a lower (Continued)

region of the ring body to support the wafer, and the plurality of wafer supports are spaced apart from one another.

13 Claims, 18 Drawing Sheets

(51) Int. Cl.
*C23C 16/455* (2006.01)
*H01J 37/32* (2006.01)
*C23C 16/458* (2006.01)

(52) U.S. Cl.
CPC .. *C23C 16/45565* (2013.01); *C23C 16/45587* (2013.01); *H01J 37/321* (2013.01); *H01J 37/32091* (2013.01); *H01J 37/32449* (2013.01); *H01J 37/32623* (2013.01); *H01L 21/6875* (2013.01); *H01L 21/68735* (2013.01)

(56) References Cited

U.S. PATENT DOCUMENTS

| | | | |
|---|---|---|---|
| 6,159,299 A | 12/2000 | Koai et al. | |
| 6,296,712 B1 | 10/2001 | Guo et al. | |
| 6,464,794 B1 | 10/2002 | Park | |
| 6,565,661 B1 | 5/2003 | Nguyen | |
| 7,198,677 B2 | 4/2007 | Yoo | |
| 8,373,086 B2* | 2/2013 | Kim | H01L 21/67751 219/121.41 |
| 8,721,833 B2 | 5/2014 | Chen et al. | |
| 8,852,349 B2 | 10/2014 | Chacin et al. | |
| 8,865,602 B2 | 10/2014 | Ranish et al. | |
| 9,412,579 B2 | 8/2016 | Sadjadi et al. | |
| 9,428,833 B1 | 8/2016 | Duvall et al. | |
| 9,558,982 B2 | 1/2017 | Pan et al. | |
| 2003/0201069 A1 | 10/2003 | Johnson | |
| 2005/0098111 A1 | 5/2005 | Shimizu et al. | |
| 2010/0132614 A1 | 6/2010 | Kato et al. | |
| 2010/0175622 A1 | 7/2010 | Yoon et al. | |
| 2010/0203736 A1 | 8/2010 | Ichino et al. | |
| 2011/0049100 A1* | 3/2011 | Han | H01L 21/68785 216/67 |
| 2012/0211486 A1* | 8/2012 | Kasai | H05B 6/806 219/679 |
| 2013/0105303 A1 | 5/2013 | Lubomirsky et al. | |
| 2013/0203258 A1 | 8/2013 | Chen et al. | |
| 2014/0113458 A1 | 4/2014 | Pan et al. | |
| 2014/0118751 A1 | 5/2014 | Rajagopalan et al. | |
| 2015/0020848 A1* | 1/2015 | Kim | H01L 21/0209 134/1.2 |
| 2015/0083333 A1 | 3/2015 | Kikuchi et al. | |
| 2015/0129130 A1 | 5/2015 | Cheng | |
| 2015/0340225 A1 | 11/2015 | Kim et al. | |
| 2016/0035566 A1 | 2/2016 | LaVoie et al. | |
| 2016/0172165 A1 | 6/2016 | Jeon et al. | |
| 2016/0340781 A1 | 11/2016 | Thomas et al. | |
| 2016/0340782 A1 | 11/2016 | Chandrasekharan et al. | |
| 2016/0348244 A1 | 12/2016 | Saabri et al. | |
| 2016/0351378 A1 | 12/2016 | Kishi et al. | |

FOREIGN PATENT DOCUMENTS

| | | |
|---|---|---|
| EP | 1134791 A2 | 9/2001 |
| JP | 2002-9136 A | 1/2002 |
| JP | 4365226 B2 | 8/2009 |
| JP | 2013191782 A | 9/2013 |
| KR | 10-2009-0024522 A | 3/2009 |
| KR | 10-2009-0057840 A | 6/2009 |
| KR | 10-0990746 B1 | 10/2010 |
| KR | 10-2012-0036464 A | 4/2012 |
| KR | 10-2014-0011364 A | 1/2014 |
| KR | 10-2014-0045806 A | 4/2014 |
| KR | 10-1432157 B1 | 8/2014 |
| KR | 2014-0100764 A | 8/2014 |
| KR | 2015-0074073 A | 7/2015 |
| KR | 10-2015-0139774 A | 12/2015 |
| KR | 2015-0139774 A | 12/2015 |
| KR | 10-2016-0137403 A | 11/2016 |
| KR | 10-2016-0137404 A | 11/2016 |
| KR | 2016-0140450 A | 12/2016 |
| WO | WO 2007/142690 A2 | 12/2007 |
| WO | WO 2014/123310 A1 | 8/2014 |

OTHER PUBLICATIONS

Examination Report of the Indian application No. 20182403674.
Search and Written Opinion issued by the Intellectual Property Office of Singapore dated Jul. 26, 2018 Corresponding Application No. SG 10201804986W.
Office action issued in copending U.S. Appl. No. 15/988,067.

* cited by examiner

DEPOSITION APPARATUS INCLUDING UPPER SHOWER HEAD AND LOWER SHOWER HEAD

CROSS-REFERENCE TO RELATED APPLICATION

Korean Patent Application No. 10-2017-0153018, filed on Nov. 16, 2017 in the Korean Intellectual Property Office, and entitled: "Deposition Apparatus Including Upper Shower Head and Lower Shower Head," is incorporated by reference herein in its entirety.

BACKGROUND

1. Field

Embodiments relate to a deposition apparatus including an upper shower head and a lower shower head.

2. Description Of Related Art

In general, integrated circuits (ICs) may be formed on the front surface of a semiconductor wafer.

SUMMARY

The embodiments may be realized by providing a deposition apparatus for depositing a material on a wafer, the apparatus including a lower shower head; an upper shower head disposed on the lower shower head, the upper shower head facing the lower shower head; and a support structure between the upper shower head and the lower shower head, the wafer being supportable by the support structure, wherein the upper shower head includes upper holes for providing an upper gas onto the wafer, the lower shower head includes lower holes for providing a lower gas onto the wafer, the support structure includes a ring body surrounding the wafer; a plurality of ring support shafts between the ring body and the lower shower head; and a plurality of wafer supports extending inwardly from a lower region of the ring body to support the wafer, and the plurality of wafer supports are spaced apart from one another.

The embodiments may be realized by providing a deposition apparatus for depositing a material on a wafer, the apparatus including an upper shower head and a lower shower head disposed within a process chamber, the upper shower head facing the lower shower head; a support structure disposed between the upper shower head and the lower shower head, the wafer being supportable on the support structure; and a plasma process region disposed between the support structure and the lower shower head, and between the wafer and the lower shower head, wherein the upper shower head includes upper holes for providing an upper gas onto the wafer, the upper holes include internal upper holes and external upper holes, the external upper holes surrounding the internal upper holes, and the external upper holes have a different size or a different arrangement density from the internal upper holes.

The embodiments may be realized by providing a deposition apparatus for depositing a material on a wafer, the apparatus including an upper shower head and a lower shower head disposed within a process chamber, the upper shower head facing each the lower shower head; a support structure disposed between the upper shower head and the lower shower head and connected to the lower shower head, the wafer being supportable on the support structure; a plasma process region disposed between the support structure and the lower shower head, and between the wafer and the lower shower head, the plasma process region being configured to form a rear reinforcing film on a rear surface of the wafer; an upper gas supply outside of the process chamber; and a gas distributor connected to the upper gas supply, wherein the upper shower head includes upper holes for providing an upper gas onto a front surface of the wafer, the upper holes include internal upper holes and external upper holes, the external upper holes surrounding the internal upper holes, the upper shower head includes an internal upper flow path connected to the internal upper holes and an external upper flow path connected to the external upper holes, and the gas distributor is connected to the internal upper flow path and the external upper flow path.

BRIEF DESCRIPTION OF DRAWINGS

Features will be apparent to those of skill in the art by describing in detail exemplary embodiments with reference to the attached drawings in which.

DETAILED DESCRIPTION

A deposition apparatus, according to an example embodiment, will be described hereinafter, with reference to the accompanying drawings.

Figure 1:
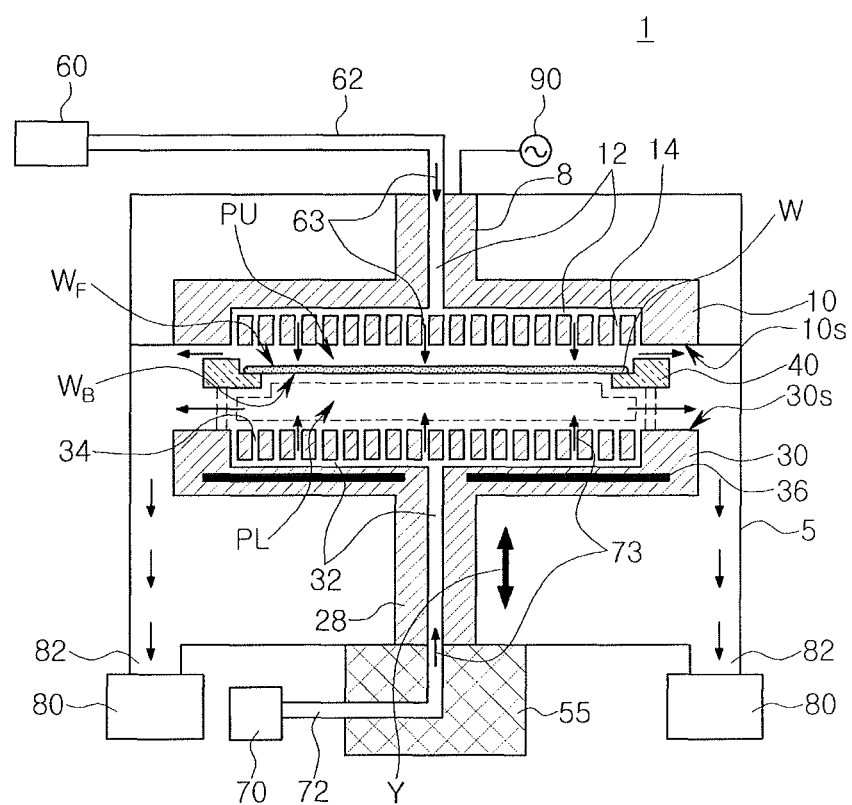
FIG. 1 illustrates a schematic cross-sectional view of a deposition apparatus, according to an example embodiment.

An example of a deposition apparatus 1, according to an example embodiment, will be described with reference to FIG. 1. FIG. 1 illustrates a schematic cross-sectional view of the deposition apparatus 1, according to an example embodiment.

Referring to FIG. 1, the deposition apparatus 1, according to an example embodiment, may include a process chamber 5, an upper shower head 10 disposed above a lower shower head 30 within the process chamber 5, the lower shower head 30 also being disposed within the process chamber 5, and a support structure 40 disposed between the upper shower head 10 and the lower shower head 30. The upper shower head 10 and the lower shower head 30 may face each other. The support structure 40 may be coupled with or attached to the lower shower head 30, and may be spaced apart from the upper shower head 10.

The deposition apparatus 1, according to an example embodiment, may include an upper gas pipe 62 (through which an upper gas 63 may move from an upper gas supply 60 into the process chamber 5), a lower gas supply 70, a lower gas pipe 72 (through which a lower gas 73 may move from the lower gas supply 70 into the process chamber 5), and a radio frequency (RF) power supply 90 generating plasma within the process chamber 5.

The upper shower head 10 may have an upper head surface 10s facing the lower shower head 30, and the lower shower head 30 may have a lower head surface 30s facing the upper head surface 10s.

In an implementation, an upper support 8 may fix the upper shower head 10 to the process chamber.

The upper shower head 10 may have an upper flow path 12 therein. The upper flow path 12 may extend into the upper support 8 to connect to the upper gas pipe 62.

The upper shower head 10 may include upper holes 14 for jetting or providing the upper gas 63 onto a wafer W. The upper holes 14 may extend internally into the upper shower head 10 from the upper head surface 10s to connect to the upper flow path 12. Thus, the upper gas 63 supplied from the upper gas supply 60 may be provided onto a front surface WF of the wafer W (supported by the support structure 40) through the upper gas pipe 62, the upper flow path 12, and the upper holes 14 in turn. The wafer W may have the front surface WF facing the upper shower head 10, and a rear surface WB facing the lower shower head 30.

The lower shower head 30 may have a lower flow path 32 therein. The lower flow path 32 may extend into a lower shaft structure 28 and into a lower structure 55 disposed below the lower shaft structure 28 to connect to the lower gas pipe 72. The lower shaft structure 28 may move the lower shower head 30 and the support structure 40 in a vertical direction Y. The lower shaft structure 28 may also be moved in the vertical direction Y by the lower structure 55 disposed below the lower shaft structure 28.

The lower shower head 30 may include lower holes 34 for providing the lower gas 73 onto the wafer W. The lower holes 34 may extend internally into the lower shower head 30 from the lower head surface 30s to connect to the lower flow path 32. Thus, the lower gas 73 supplied from the lower gas supply 70 may be provided onto the rear surface WB of the wafer W through the lower gas pipe 72, the lower flow path 32, and the lower holes 34 in turn.

Thus, the deposition apparatus 1, according to an example embodiment, may perform a deposition process for forming a rear reinforcing film on the rear surface WB of the wafer W supported by the support structure 40.

The deposition apparatus 1, according to an example embodiment, may also perform a deposition process for depositing a front reinforcing film on an edge of the front surface WF of the wafer W, while depositing a rear reinforcing film on the rear surface WB of the wafer W supported by the support structure 40.

While RF power is supplied to the RF power supply 90, plasma may be generated by the lower gas 73 between the rear surface WB of the wafer W and the lower shower head 30. As described above, plasma generated by the lower gas 73 may be used to deposit a rear reinforcing film, e.g., a silicon oxide film or a silicon nitride film, on the rear surface WB of the wafer W. The lower gas 73 may be a plasma process source gas that may be used to form a silicon oxide film or a silicon nitride film by a plasma process. A region in which plasma may be generated by the lower gas 73 may be defined as a "plasma process region PL." The plasma process region PL may be defined between the support structure 40 and the lower shower head 30, and between the wafer W and the lower shower head 30.

The upper gas 63 may be supplied from the upper gas supply 60 and provided to an upper purge region PU on the front surface WF of the wafer W through the upper holes 14 of the upper shower head 10. The upper gas 63 may be a purge gas by which plasma may not be generated, even when RF power is supplied to the RF power supply part 90. In an implementation, the upper gas 63 may be a purge gas, e.g., nitrogen. The upper purge region PU may prevent plasma generated in the plasma process region PL from being deposited on the front surface WF of the wafer W. Thus, the upper purge region PU may prevent the front surface WF of the wafer W from being damaged or contaminated.

In an implementation, the upper gas 63 and the lower gas 73 provided to a space between the upper shower head 10 and the lower shower head 30 may be discharged through an exhaust or discharge portion 82 disposed in a lower region of the process chamber 5. The discharge portion 82 may connect to a vacuum pump 80, and the upper gas 63 and the lower gas 73 may be discharged by vacuum intake force generated by the vacuum pump 80.

Figure 2:
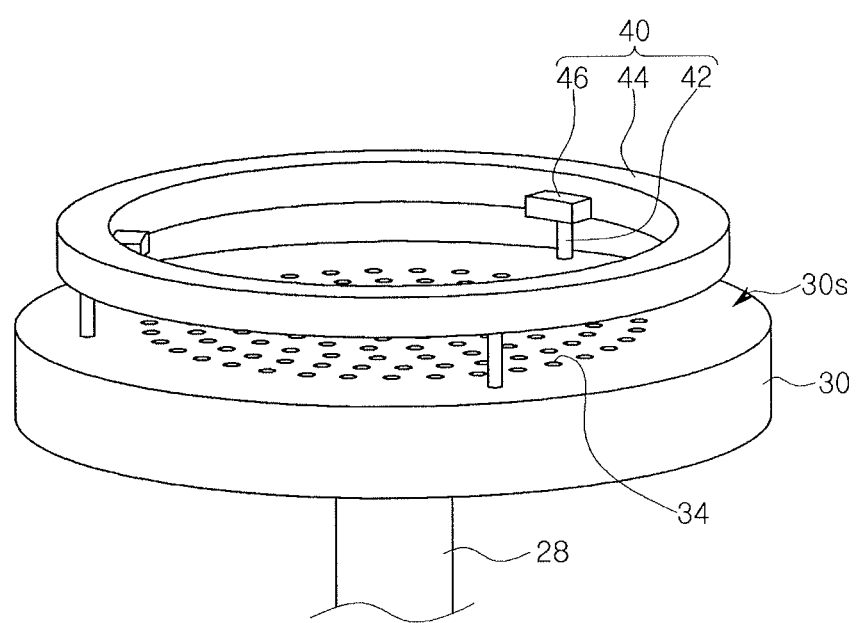
FIG. 2 illustrates a schematic perspective view of a portion of a deposition apparatus, according to an example embodiment.
Figure 3:
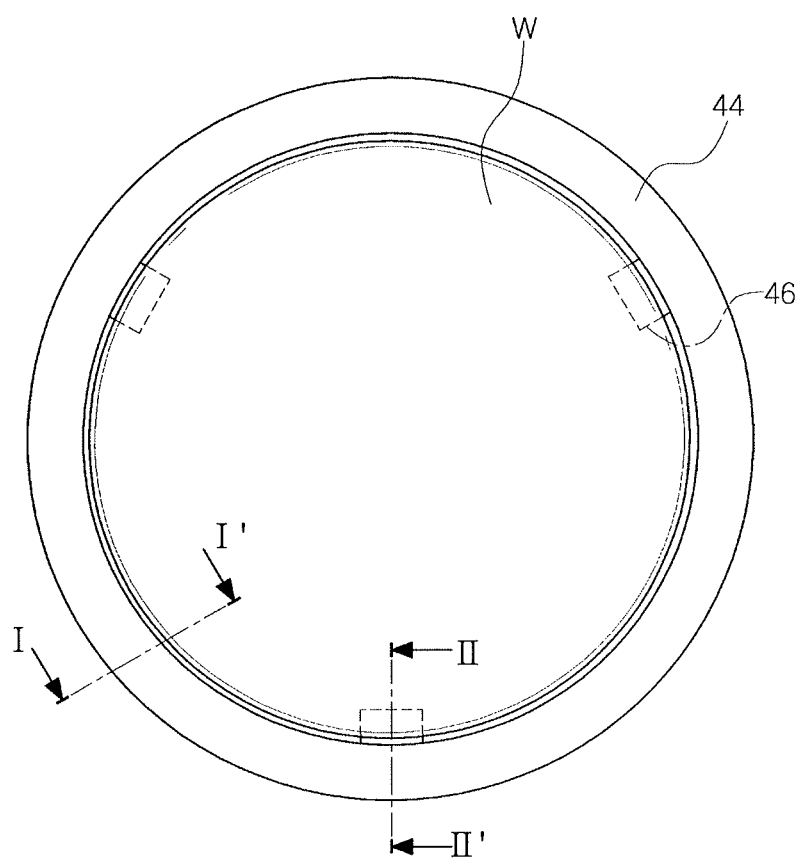
FIG. 3 illustrates a plan view of a portion of a deposition apparatus, according to an example embodiment.
Figure 4:
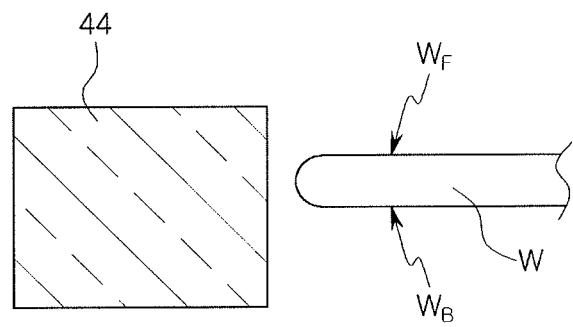
FIGS. 4 and 5 illustrate cross-sectional views of a portion of a deposition apparatus, according to an example embodiment.
Figure 5:
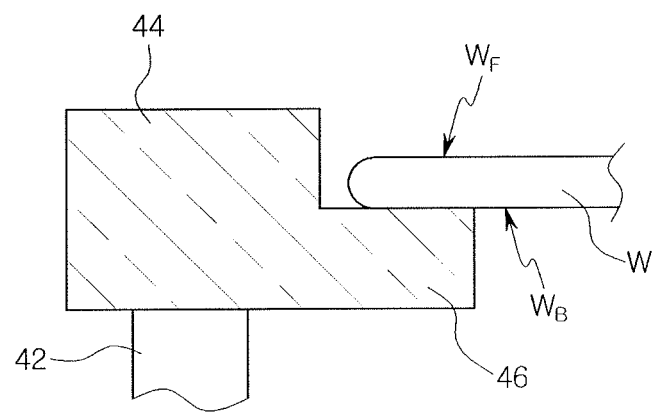

An example of the support structure 40, supporting the wafer W, will be described with reference to FIGS. 1 through 5. FIG. 2 illustrates a schematic perspective view of the support structure 40 of the deposition apparatus 1, according to an example embodiment; FIG. 3 illustrates a schematic plan view of the support structure 40, and the wafer W seated on the support structure 40; FIG. 4 illustrates a cross-sectional view taken along line I-I' of FIG. 3; and FIG. 5 illustrates a cross-sectional view taken along line II-II' of FIG. 3.

Referring to FIGS. 1 through 5, the support structure 40 may be disposed above the lower head surface 30s of the lower shower head 30 (e.g., between the lower shower head 30 and the upper shower head 10).

The support structure 40 may include a ring body 44 surrounding the wafer W (to be supported thereon); a plurality of ring support shafts 42 extending downwardly from the ring body 44 to connect to the lower shower head 30; and a wafer support 46 extending inwardly from a lower region of the ring body 44 to support the wafer W. In an implementation, the wafer support 46 may be provided as a plurality of wafer supports 46.

When the lower shower head 30 and the support structure 40 are moved upwardly by the lower shaft structure 28, the ring body 44 of the support structure 40 may be closer to the upper shower head 10 than to the lower shower head 30.

Figure 6A:
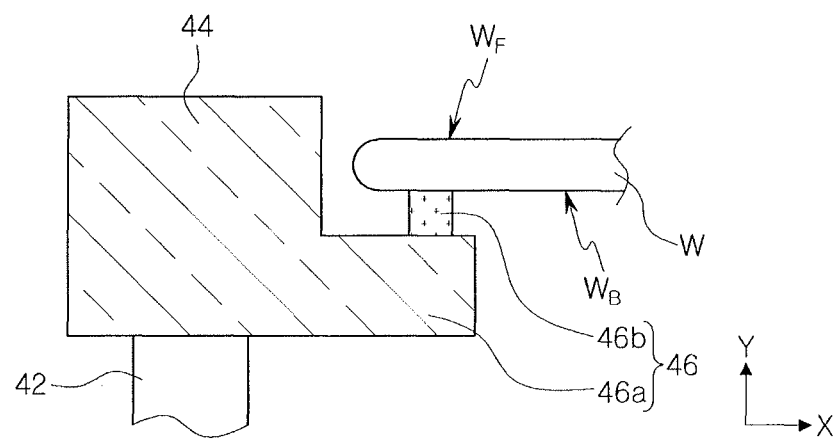
FIG. 6A illustrates a cross-sectional view of a modified example of a portion of a deposition apparatus, according to an example embodiment.

In an implementation, the wafer support 46 may be provided as a plurality of wafer supports 46, each of which may have a plate shape having a certain thickness. In an implementation, the wafer support 46 may be modified to have various suitable shapes. A modified example of the wafer support 46 will be described with reference to FIG. 6A. FIG. 6A illustrates a schematic cross-sectional view of the modified example of the wafer support 46.

Figure 6B:
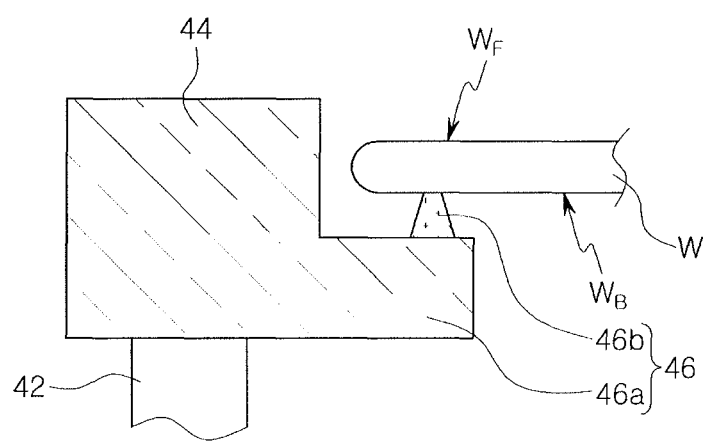
FIG. 6B illustrates a cross-sectional view of a modified example of a portion of a deposition apparatus, according to an example embodiment.

Referring to FIG. 6A, the wafer support 46 may include a support body 46a extending inwardly from the ring body 44, and a support tip 46b extending from the support body 46a in a direction Y perpendicular to the extension direction X of the support body 46a (e.g., in the vertical direction Y). In an implementation, the support tip 46b may have a quadrangular shape (e.g., in cross section). A modified example of the support tip 46b will be described with reference to FIG. 6B. FIG. 6B illustrates a schematic cross-sectional view of the modified example of the support tip 46b. Referring to FIG. 6B, in an implementation, the support tip 46b may have a width that narrows in a direction upwardly moving away from the support body 46a (e.g., the support tip 46b may have a trapezoidal shape in cross section, such that a region of the support tip 46b proximate to the support body 46a has a width that is greater than a width of a region of the support tip 46b distal to the support body 46a).

Various examples of the support tip 46b will be described with reference to FIGS. 7A through 7D. FIGS. 7A through 7D illustrate perspective views of the various examples of the support tip 46b.

Figure 7A:
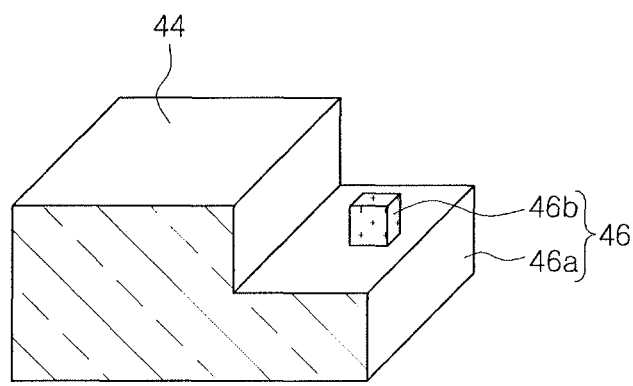
FIG. 7A illustrates a schematic perspective view of a portion of a deposition apparatus, according to an example embodiment.

Referring to FIG. 7A, a support tip 46b may have a quadrangular columnar shape (e.g., hexahedral or cuboid).

Figure 7B:
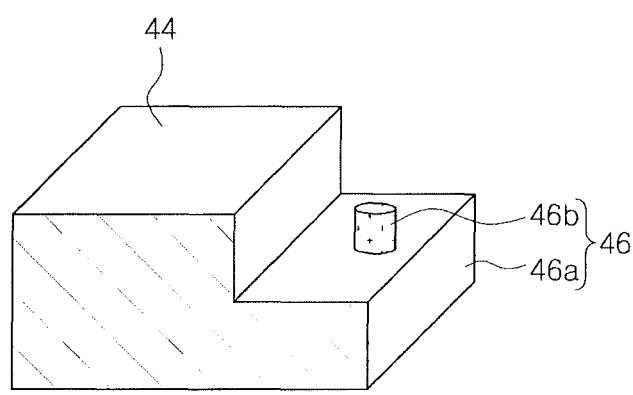
FIG. 7B illustrates a schematic perspective view of a modified example of a portion of a deposition apparatus, according to an example embodiment.

Referring to FIG. 7B, a support tip 46b may have a cylindrical shape.

Figure 7C:
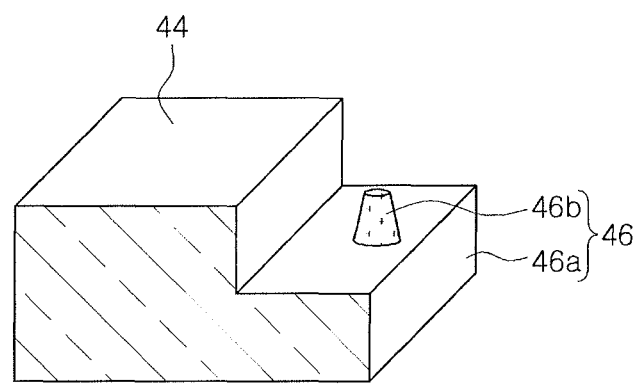
FIG. 7C illustrates a schematic perspective view of a modified example of a portion of a deposition apparatus, according to an example embodiment.

Referring to FIG. 7C, a support tip 46b may have a cylindrical shape with a width narrowing upwardly (e.g., a partial conical shape).

Figure 7D:
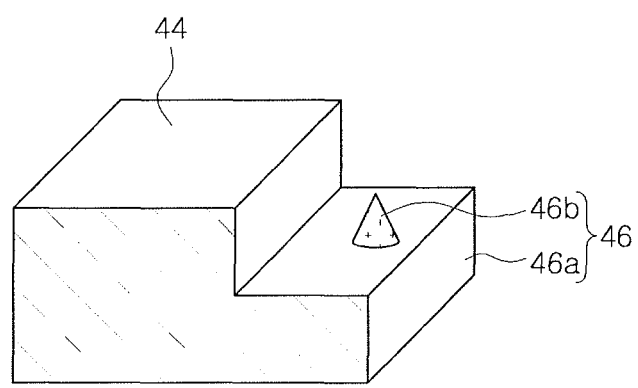
FIG. 7D illustrates a schematic perspective view of a modified example of a portion of a deposition apparatus, according to an example embodiment.

Referring to FIG. 7D, a support tip 46b may have a conical shape with a width narrowing upwardly (e.g., coming to a point or vertex).

Figure 8A:
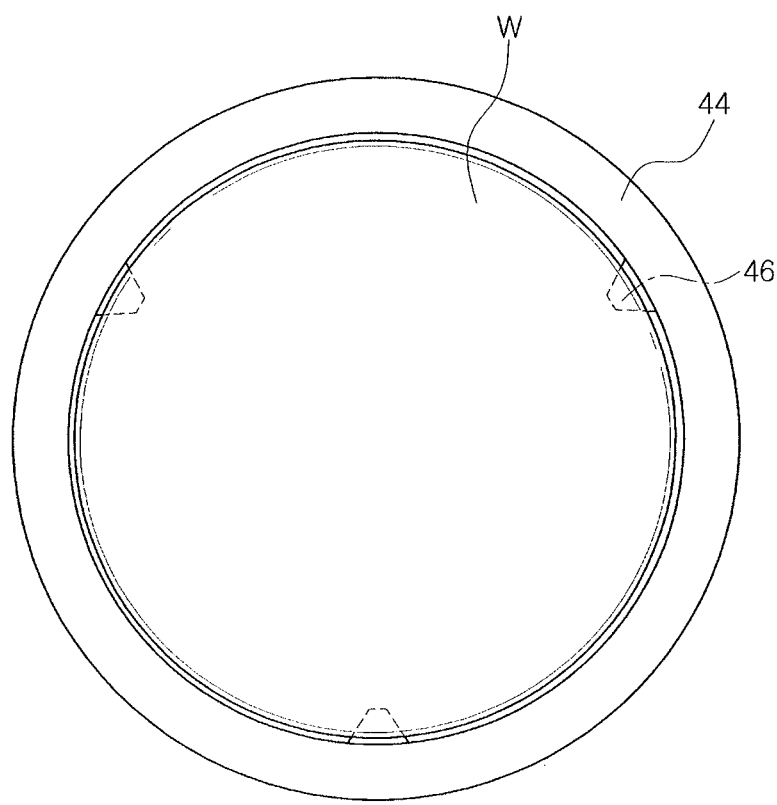
FIG. 8A illustrates a plan view of a modified example of a portion of a deposition apparatus, according to an example embodiment.
Figure 8B:
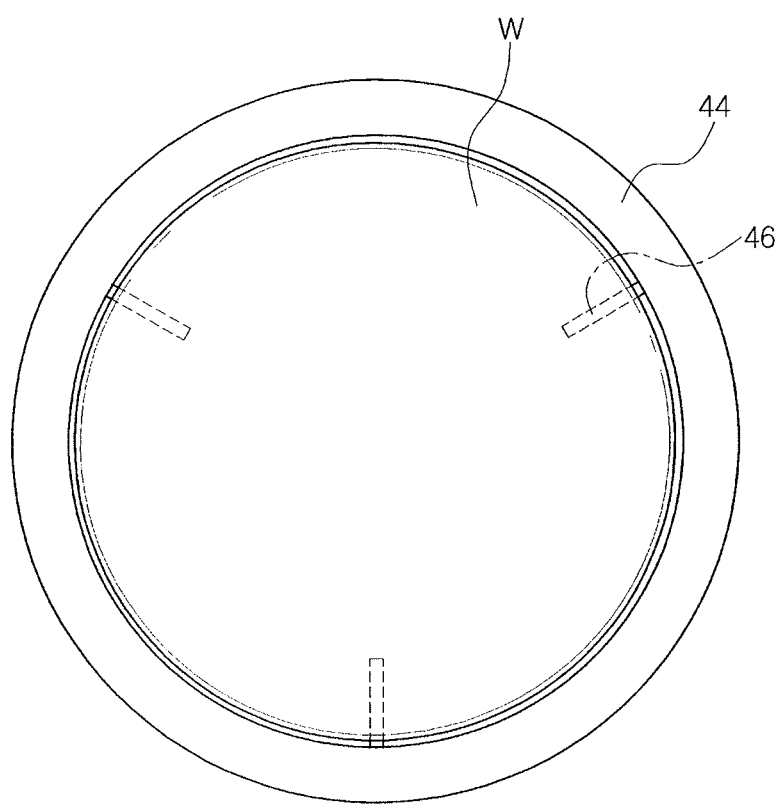
FIG. 8B illustrates a plan view of a modified example of a portion of a deposition apparatus, according to an example embodiment.

Referring again to FIG. 3, when viewed in plan, the wafer support 46 may have a quadrangular shape extending inwardly from the ring body 44 to have a certain width. In an implementation, the length of the wafer support 46, extending inwardly from the ring body 44 may be less than the width thereof. Modified examples of the wafer support 46 will be described with reference to FIGS. 8A and 8B. FIGS. 8A and 8B illustrate plan views of the modified examples of the wafer support 46.

Referring to FIG. 8A, when viewed in plan, the width of the wafer support 46 may narrow in the inward direction of the ring body 44 (e.g., to have a trapezoidal shape).

Referring to FIG. 8B, the length of the wafer support 46, extending inwardly from the ring body 44, may be greater than the width thereof.

Figure 9:
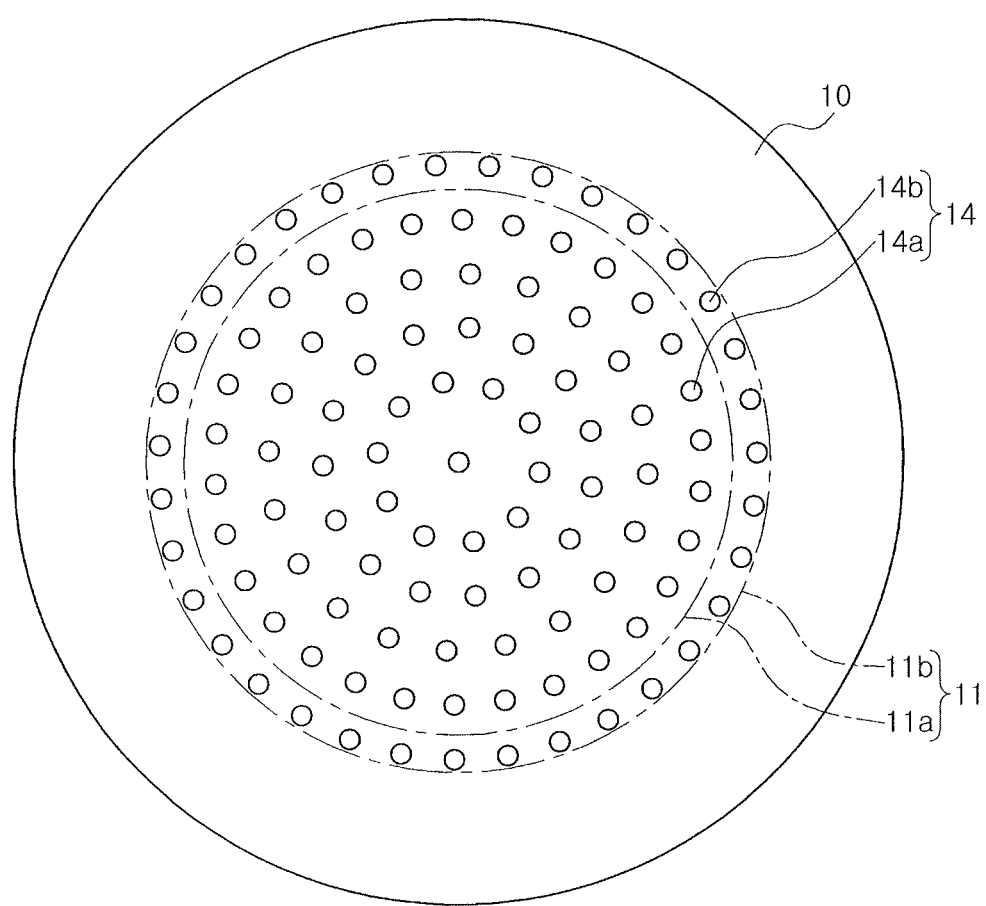
FIG. 9 illustrates a plan view of a portion of a deposition apparatus, according to an example embodiment.

The upper holes 14, formed in the upper head surface 10s of the upper shower head 10, will be described with reference to FIGS. 1 and 9. FIG. 9 illustrates a plan view illustrating the upper head surface 10s of the upper shower head 10 including the upper holes 14.

Referring to FIGS. 1 and 9, the upper head surface 10s of the upper shower head 10 may have an upper hole region 11, in which the upper holes 14 may be formed.

The upper holes 14 may include internal upper holes 14a, and external upper holes 14b surrounding the internal upper holes 14a (e.g., extending around the internal upper holes 14a).

In an implementation, a region, in which the internal upper holes 14a may be disposed, may be referred to as an "internal upper hole region 11a," and a region, in which the external upper holes 14b may be disposed, may be referred to as an "external upper hole region 11b."

In an implementation, the internal upper holes 14a and the external upper holes 14b may have circular shapes of the same size (e.g., diameter).

In an implementation, an arrangement density of the external upper holes 14b may be substantially the same as that of the internal upper holes 14a.

Figure 10A:
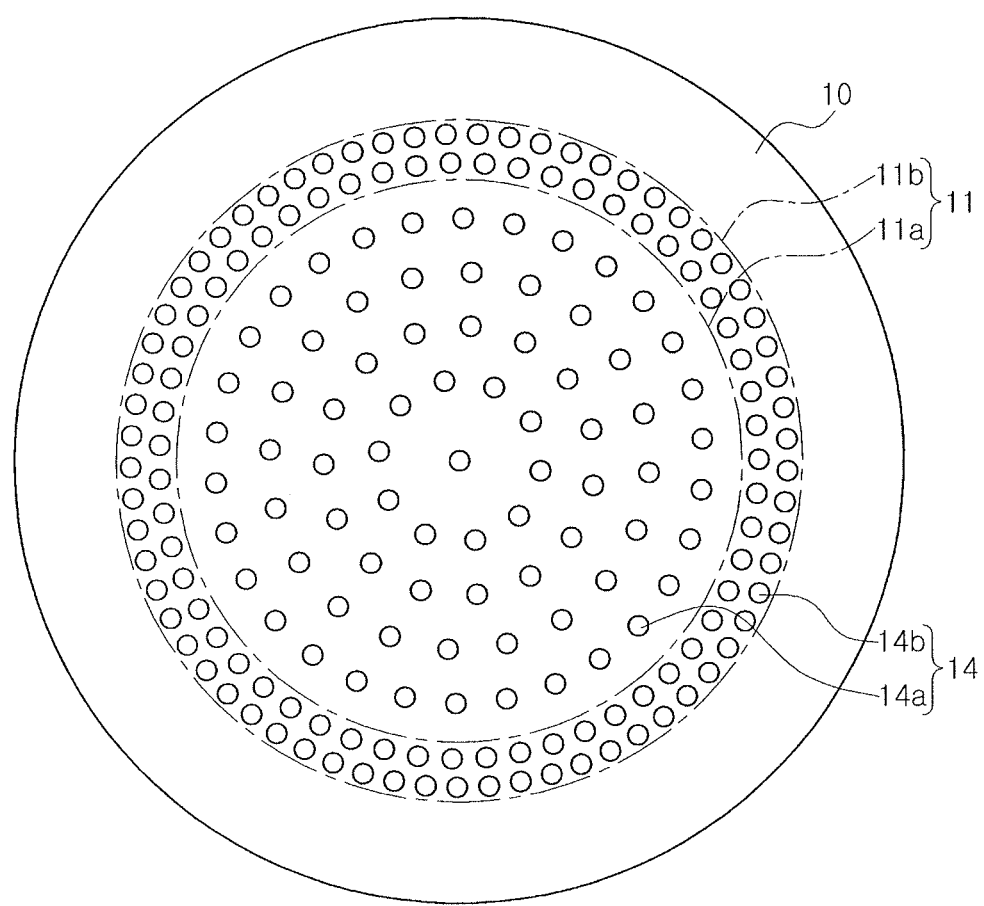
FIG. 10A illustrates a plan view of a modified example of a portion of a deposition apparatus, according to an example embodiment.

In an implementation, the internal upper holes 14a and the external upper holes 14b may have the same size and the same arrangement density. In an implementation, the internal upper holes 14a and the external upper holes 14b may be modified to have different sizes or different arrangement densities. A modified example of the internal upper holes 14a and the external upper holes 14b, as described above, will be described with reference to FIG. 10A. FIG. 10A illustrates a plan view of the modified example of the internal upper holes 14a and the external upper holes 14b.

Referring to FIG. 10A, the arrangement density of the external upper holes 14b of the upper holes 14 may be higher than the arrangement density of the internal upper holes 14a thereof. For example, the internal upper holes 14a and the external upper holes 14b may have the same size, and a distance between the external upper holes 14b may be less than that between the internal upper holes 14a. Thus, the upper hole region 11 of the upper head surface 10s may include the internal upper hole region 11a, in which the internal upper holes 14a may be disposed, and the external upper hole region 11b, in which the external upper holes 14b, having a relatively higher arrangement density than the internal upper holes 14a, may be disposed.

Figure 10B:
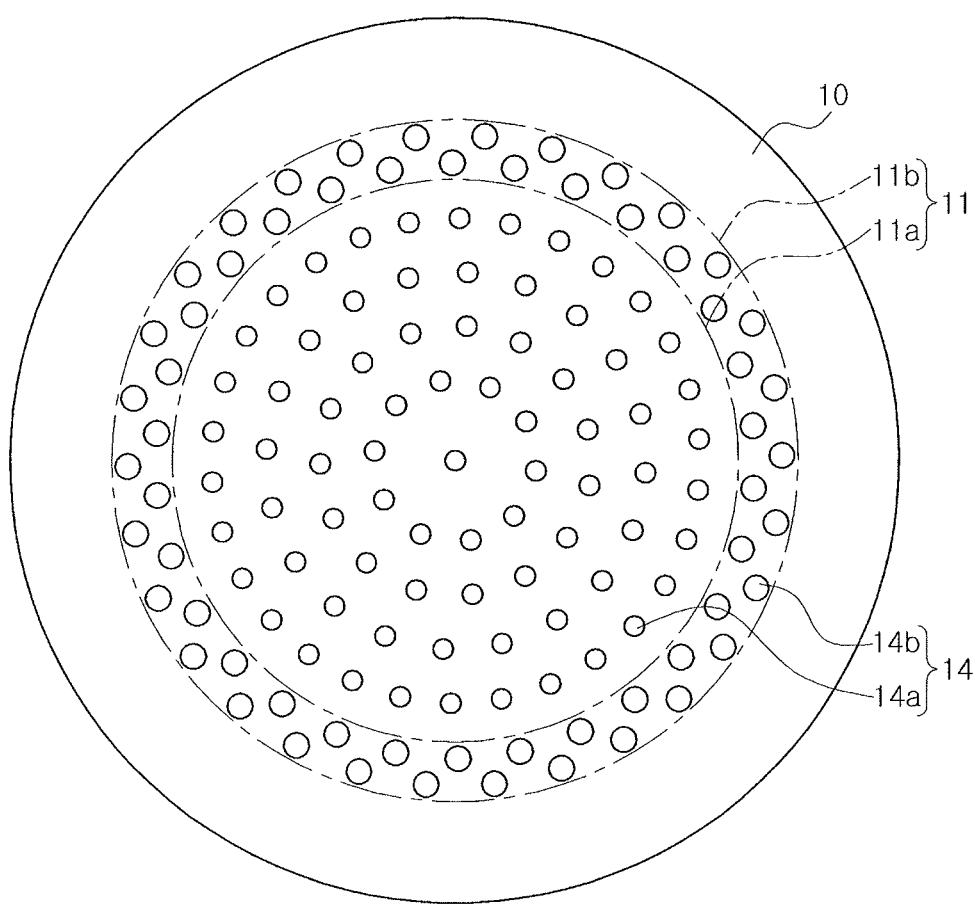
FIG. 10B illustrates a plan view of a modified example of a portion of a deposition apparatus, according to an example embodiment.

In an implementation, the external upper holes 14b may have a different arrangement density from the internal upper holes 14a, and may have the same size as the internal upper holes 14a. In an implementation, the external upper holes 14b may be modified to have a different size from the internal upper holes 14a. A modified example of the external upper holes 14b and the internal upper holes 14a, having different sizes, as described above, will be described with reference to FIG. 10B. FIG. 10B illustrates a plan view of the modified example of the external upper holes 14b and the internal upper holes 14a, having different sizes.

Referring to FIG. 10B, each of the external upper holes 14b (disposed within the external upper hole region 11b) may have a diameter that is greater than a diameter of each of the internal upper holes 14a (disposed within the internal upper hole region 11a). In an implementation, a distance between adjacent external upper holes 14b may be less than a distance between adjacent internal upper holes 14a.

Figure 11:
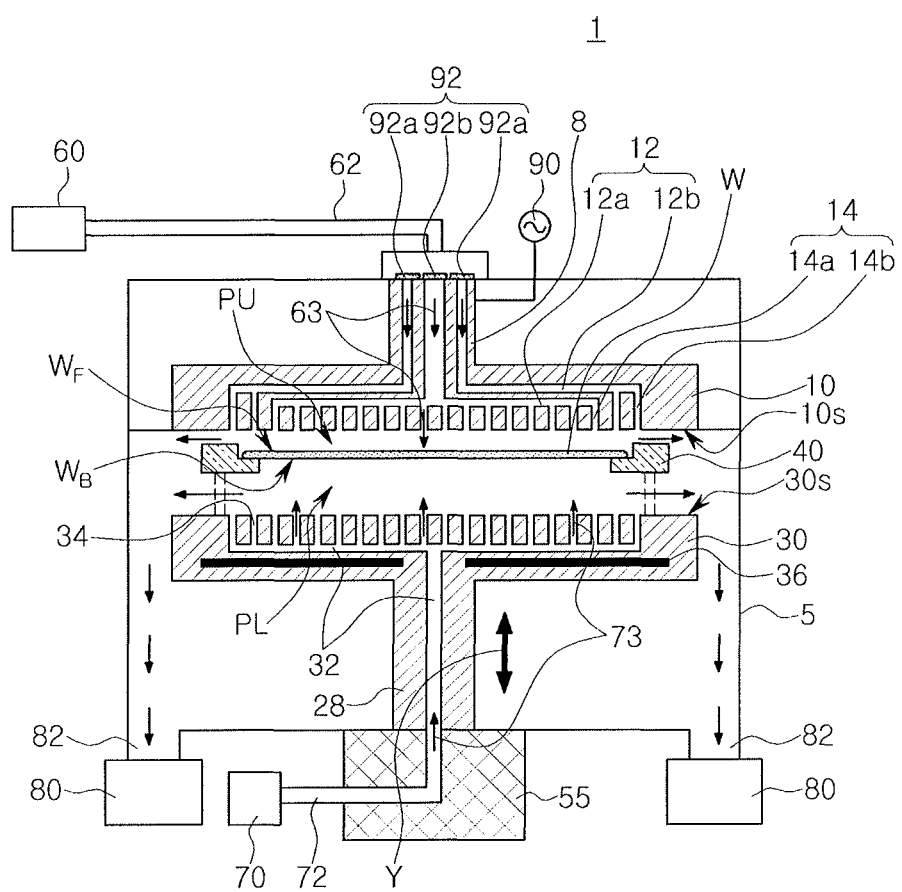
FIG. 11 illustrates a schematic cross-sectional view of a modified example of a deposition apparatus, according to an example embodiment.

In an implementation, referring again to FIG. 1, the upper holes 14 may connect to a common upper flow path 12. For example, the internal upper holes 14a (FIGS. 9, 10A, and 10B) and the external upper holes 14b (FIGS. 9, 10A, and 10B) may connect to the common upper flow path 12. In an implementation, the internal upper holes 14a (FIGS. 9, 10A, and 10B) and the external upper holes 14b (FIGS. 9, 10A, and 10B) may connect to upper flow paths spaced apart or isolated from each other. A modified example of the deposition apparatus 1, including the internal upper holes 14a and the external upper holes 14b connectable to different upper flow paths, as described above, will be described with reference to FIG. 11. FIG. 11 illustrates a schematic cross-sectional view of the modified example of the deposition apparatus 1, including the internal upper holes 14a and the external upper holes 14b connectable to different upper flow paths.

Referring to FIG. 11, the deposition apparatus 1 may include the process chamber 5, the lower shaft structure 28, the lower shower head 30, the support structure 40 supporting the wafer W, the upper gas supply 60, the upper gas pipe 62, the lower gas supply 70, the lower gas pipe 72, the discharge portion 82, and the RF power supply 90.

The upper shower head 10 may face the lower shower head 30. The upper shower head 10 may include internal upper holes 14a, and external upper holes 14b surrounding the internal upper holes 14a. The internal and external upper holes 14a and 14b may be the same as those described above with reference to FIG. 9, 10A, or 10B.

The upper head surface 10s may include different upper flow paths 12a and 12b. The upper flow paths 12a and 12b may include an internal upper flow path 12a connected to the internal upper holes 14a, and an external upper flow path 12b connected to the external upper holes 14b. The internal and external upper flow paths 12a and 12b may extend into the upper support 8 of the upper shower head 10 to connect to the upper gas pipe 62.

In an implementation, a gas distributor 92 may be disposed between the internal and external upper flow paths 12a and 12b and the upper gas pipe 62. The gas distributor 92 may include an internal flow controller 92a connected to the internal upper flow path 12a, and an external flow controller 92b connected to the external upper flow path 12b.

The internal flow controller 92a may adjust a flow rate of the upper gas 63 provided through the internal upper holes 14a, and the external flow controller 92b may adjust a flow rate of the upper gas 63 provided through the external upper holes 14b.

The upper gas 63 may be provided onto an edge of the wafer W (supported by the support structure 40) through the external upper holes 14b.

The internal flow controller 92a of the gas distributor 92 may adjust a flow rate of the upper gas 63 provided onto a center of the wafer W, and the external flow controller 92b of the gas distributor 92 may adjust a flow rate of the upper gas 63 provided onto the edge of the wafer W.

For example, the internal flow controller 92a of the gas distributor 92 may relatively reduce the flow rate of the upper gas 63 provided onto the center of the wafer W, thus preventing the wafer W from being bent by the upper gas 63, and the external flow controller 92b of the gas distributor 92 may relatively increase the flow rate of the upper gas 63 provided onto the edge of the wafer W, thus preventing plasma generated in the plasma process region PL from penetrating between the front surface WF of the wafer W and the upper shower head 10 along an external surface of the support structure 40. Thus, a reinforcing film may be prevented from being deposited on the front surface WF of the wafer W, while a reinforcing film is deposited on the rear surface WB of the wafer W.

In an implementation, the deposition apparatus 1 may deposit a reinforcing film on the rear surface WB of the wafer W, using plasma generated in the plasma process region PL, while significantly reducing a warpage phenomenon of the wafer W, through the adjustment of the flow rate of the upper gas 63 provided onto the central portion or the edge of the wafer W. Thus, the reinforcing film formed on the rear surface WB of the wafer W may further significantly reduce the warpage phenomenon of the wafer W.

Figure 12:
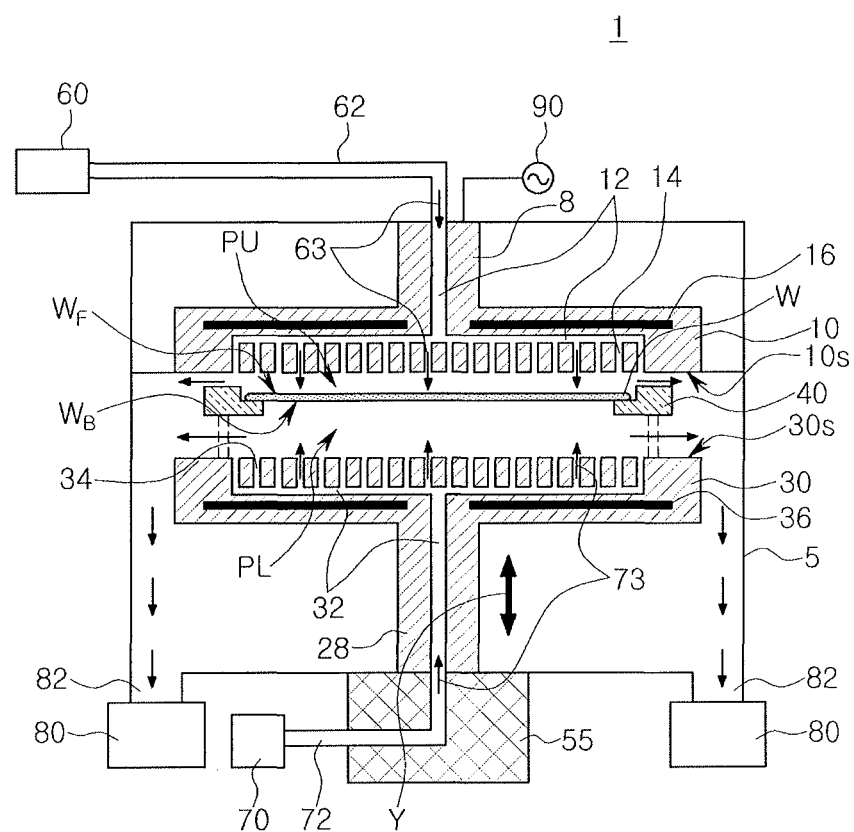
FIG. 12 illustrates a schematic cross-sectional view of a modified example of a deposition apparatus, according to an example embodiment.

Referring again to FIG. 1, the lower shower head 30 may include a lower heater 36 disposed therewithin. The lower heater 36 may adjust a process temperature of the plasma process region PL. Thus, the deposition apparatus 1, according to an example embodiment, may adjust the process temperature, using the lower heater 36. A modified example of the lower heater 36 will be described with reference to FIG. 12. FIG. 12 illustrates a schematic cross-sectional view of a modified example of the deposition apparatus 1, according to an example embodiment.

Referring to FIG. 12, the deposition apparatus 1, according to an example embodiment, may adjust the process temperature, using an upper heater 16 disposed within the upper shower head 10, together with the lower heater 36 disposed within the lower shower head 30.

Figure 13:
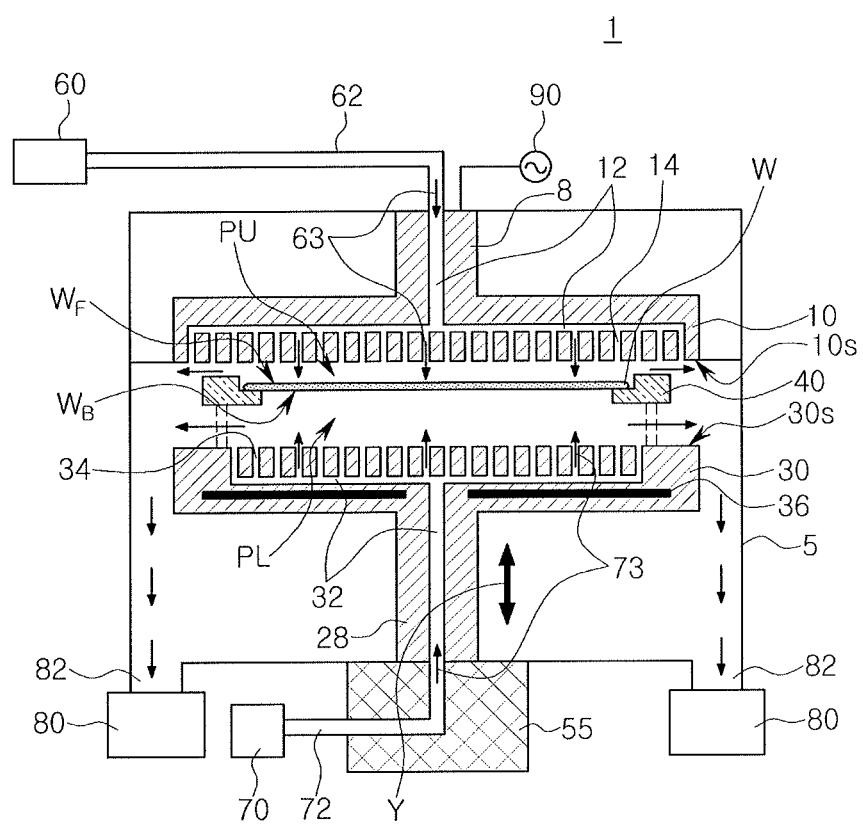
FIG. 13 illustrates a schematic cross-sectional view of a modified example of a deposition apparatus, according to an example embodiment.
Figure 14:
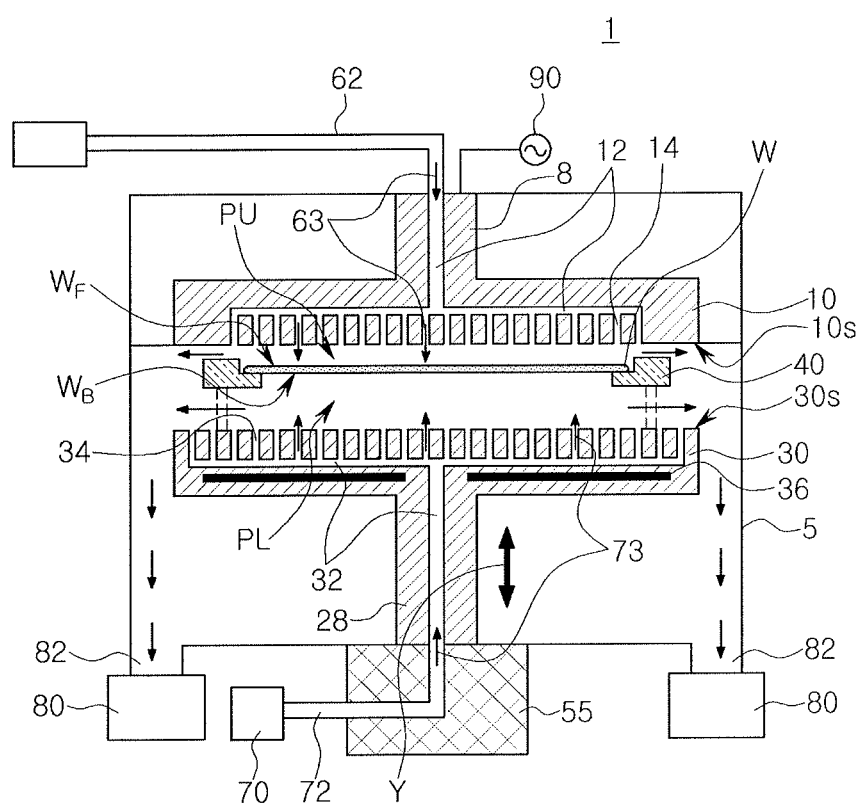
FIG. 14 illustrates a schematic cross-sectional view of a modified example of a deposition apparatus, according to an example embodiment.

In an implementation, referring again to FIG. 1, a region of the upper shower head 10 in which the upper holes 14 are formed may be substantially the same as (e.g., aligned or congruent with) a region of the lower shower head 30 in which the lower holes 34 are formed. In an implementation, a size of the region of the upper shower head 10 in which the upper holes 14 are formed may be different from a size of the region of the lower shower head 30 in which the lower holes 34 are formed. As described above, examples in which the size of the region of the upper shower head 10 in which the upper holes 14 are formed may be different from that of the region of the lower shower head 30 in which the lower holes 34 are formed, will be described with reference to FIGS. 13 and 14. FIGS. 13 and 14 illustrate cross-sectional views conceptually showing modified examples of the deposition apparatus 1, in order to describe the examples, in which the size of the region of the upper shower head 10 in which the upper holes 14 are formed may be different from the region of the lower shower head 30 in which the lower holes 34 are formed.

Referring to FIG. 13, the region of the upper shower head 10 in which the upper holes 14 are formed may be greater (e.g., in size or area) than the region of the lower shower head 30 in which the lower holes 34 are formed.

Referring to FIG. 14, the region of the lower shower head 30 in which the lower holes 34 are formed may be greater (e.g., in size or area) than the region of the upper shower head 10 in which the upper holes 14 are formed.

A plurality of layers may be deposited on the front surface WF of the wafer W to form an integrated circuit (IC), and a plurality of etching processes may be performed to form various front patterns having a nonuniform thickness. Depending on types and shapes of front patterns formed, various types of stress and bowing problems could otherwise occur in the wafer W having such various front patterns formed thereon.

According to an example embodiment, the deposition apparatus 1 that may form a rear reinforcing film on the rear surface WB of the wafer W may be provided to address various types of stress and bowing issues. Further, according to an example embodiment, there may be provided the deposition apparatus 1 that may form a front reinforcing film on the edge of the front surface WF of the wafer W, while forming a rear reinforcing film on the rear surface WB of the wafer W.

Examples of the wafer W on which the deposition process has been performed using the above-mentioned deposition apparatus 1 according to an example embodiment, will be described with reference to FIGS. 15A through 15D. The rear surface WB of the wafer W to be described below may be understood as facing the above-mentioned lower shower head 30, and the front surface WF of the wafer W to be described below may be understood as facing the above-mentioned upper shower head 10. Further, the front surface WF of the wafer W may be understood as having the front pattern 100 formed thereon to form a semiconductor IC.

Figure 15A:
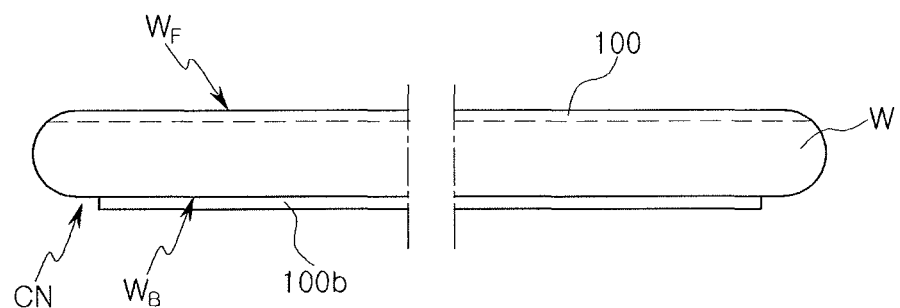
FIGS. 15A, 15B, 15C, and 15D illustrate cross-sectional views conceptually showing examples of a wafer that may be formed by a deposition apparatus, according to an example embodiment.

Referring to FIG. 15A, the wafer W on which the deposition process has been performed using the deposition apparatus 1 described above with reference to FIG. 1, may include a rear reinforcing film 100*b* formed on the rear surface WB of the wafer W. The rear surface WB of the wafer W may include a contact portion CN which may be in contact with the wafer support 46 of FIG. 3 or 5, so that the rear reinforcing film 100*b* may not be formed on the contact portion CN.

In an implementation, since the wafer support 46 of FIG. 3 or 5 may be formed as a plurality of wafer supports 46 spaced apart from each other, an area of the contact portion CN on the rear surface WB of the wafer W may be significantly reduced. Thus, the deposition apparatus 1, according to an example embodiment, may have the rear reinforcing film 100*b* formed on the rear surface WB of the wafer W, such that the rear reinforcing film 100*b* may have a relatively greater area, in order to address the stress and bowing of the wafer W.

Figure 15B:
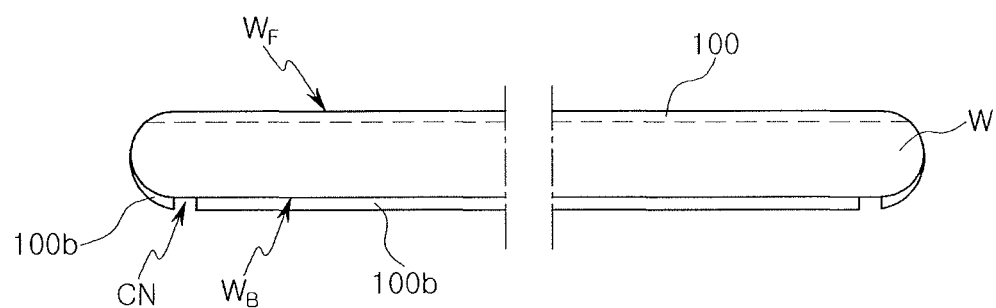

Referring to FIG. 15B, the wafer W on which the deposition process has been performed using the deposition apparatus 1 including the support tip 46*b*, described above with reference to FIG. 6A or 6B, may include a rear reinforcing film 100*b* disposed on the rear surface WB of the wafer W to extend to an edge of the rear surface WB of the wafer W. The support tip 46*b* of FIG. 6A or 6B may significantly reduce a contact area between the wafer support 46 and the wafer W, an area of the contact portion CN between the support tip 46*b* of FIG. 6A or 6B and the wafer W on the rear surface WB of the wafer W may be significantly reduced. Thus, the rear reinforcing film 100*b* formed on the rear surface WB of the wafer W may have a relatively greater area, in order to address the stress and bowing of the wafer W.

Figure 15C:
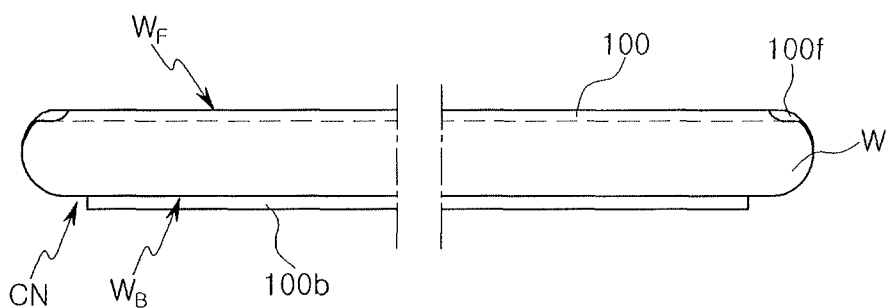

Referring to FIG. 15C, the wafer W on which the deposition process has been performed using the deposition apparatus 1 described above with reference to FIG. 11 or 14, may include a front reinforcing film 100*f* formed on an edge of the front surface WF of the wafer W, and a rear reinforcing film 100*b* formed on the rear surface WB of the wafer W. In an implementation, the front pattern 100 may not be formed on the edge of the wafer W, or may have a further reduced thickness on the edge of the wafer W than on the center of the wafer W. Thus, the front reinforcing film 100*f* may complement or reinforce the front pattern 100 formed on the front surface WF of the wafer W, and the front reinforcing film 100*f* may help to significantly reduce the warpage phenomenon of the wafer W.

In an implementation, as described above with reference to FIG. 11, the flow rate of the upper gas 63 provided through the external upper holes 14*b* using the external flow controller 92*b* may be reduced, so that plasma generated by the lower gas 73 provided through the lower holes 34 may be formed on the edge of the front surface WF of the wafer W along the external surface of the support structure 40. Thus, the front reinforcing film 100*f* may be formed on the edge of the front surface WF of the wafer W, while the rear reinforcing film 100*b* may be formed on the rear surface WB of the wafer W.

In an implementation, as described above with reference to FIG. 14, the area of the lower shower head 30 in which the lower holes 34 are formed may be greater than the area of the upper shower head 10 in which the upper holes 14 are formed, and plasma generated by the lower gas 73 provided through the lower holes 34 may be formed on the edge of the front surface WF of the wafer W along the external surface of the support structure 40. Thus, the front reinforcing film 100*f* may be formed on the edge of the front surface WF of the wafer W, while the rear reinforcing film 100*b* may be formed on the rear surface WB of the wafer W.

Figure 15D:
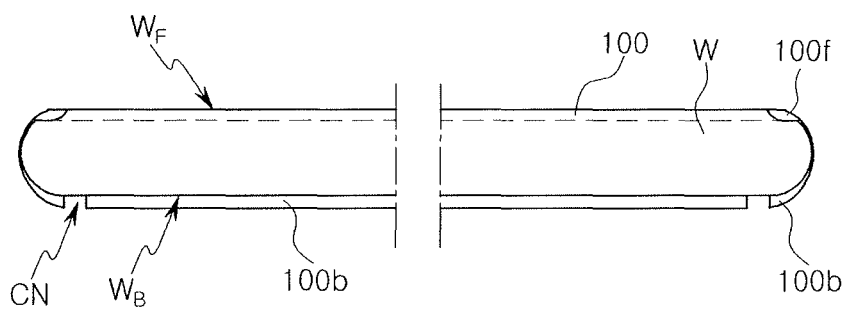

Referring to FIG. 15D, the deposition apparatus 1 described above with reference to FIG. 11 or 14 may include the support tip 46*b* described above with reference to FIG. 6A or 6B. The wafer W on which the deposition process has been performed using the deposition apparatus 1, as described above, may include a front reinforcing film 100*f* formed on the edge of the front surface WF of the wafer W, and the rear reinforcing film 100*b* disposed on the rear surface WB of the wafer W to extend to the edge of the rear surface WB of the wafer W.

By way of summation and review, ICs may be formed by repeating semiconductor fabrication processes, such as a deposition process, a photolithography process, and an etching process, on the front surface of the semiconductor wafer. As the semiconductor fabrication process for forming the ICs proceeds, front patterns may be formed to a uniform thickness. Stress generated by such front patterns could cause a bowing phenomenon in which the semiconductor wafer may be warped.

As set forth above, according to example embodiments, a deposition apparatus, including an upper shower head and a lower shower head, may be provided. The deposition apparatus may form a larger area of a rear reinforcing film on a rear surface of a wafer more uniformly, and the deposition apparatus may reduce a warpage phenomenon of the wafer.

According to example embodiments, the deposition apparatus may be provided to form a front reinforcing film on an edge of a front surface of the wafer, while forming the rear reinforcing film on the rear surface of the wafer, in order to reduce the warpage phenomenon of the wafer.

The embodiments may provide a deposition apparatus that may perform a deposition process on a rear surface of a wafer.

The embodiments may provide a deposition apparatus including an upper shower head and a lower shower head.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A deposition apparatus for depositing a material on a wafer, the deposition apparatus comprising:
   a lower shower head;
   an upper shower head disposed on the lower shower head, the upper shower head facing the lower shower head; and
   a support structure between the upper shower head and the lower shower head, the wafer being supportable by the support structure,
   wherein:
   the upper shower head includes upper holes for providing an upper gas onto the wafer,
   the lower shower head includes lower holes for providing a lower gas onto the wafer,
   the support structure includes:
     a ring body surrounding the wafer;
     a plurality of ring support shafts between the ring body and the lower shower head; and
     a plurality of wafer supports extending inwardly from a lower region of the ring body to support the wafer, and
   the plurality of wafer supports are circumferentially spaced apart from one another.

2. The deposition apparatus as claimed in claim 1, further comprising a lower shaft structure disposed on a lower portion of the lower shower head to move the lower shower head and the support structure in a vertical direction,
   wherein, when the lower shower head and the support structure are moved upwardly by the lower shaft structure, the ring body of the support structure is closer to the upper shower head than to the lower shower head.

3. The deposition apparatus as claimed in claim 1, wherein each of the plurality of wafer supports includes:
   a support body extending inwardly from the lower region of the ring body, and
   a support tip disposed on the support body.

4. The deposition apparatus as claimed in claim 3, wherein the support tip includes a portion that is narrower in a direction moving away from the support body.

5. The deposition apparatus as claimed in claim 1, wherein the wafer support includes a portion that is narrower in a direction moving inwardly from of the ring body.

6. The deposition apparatus as claimed in claim 1, wherein:
   the upper shower head includes an upper hole region in which the upper holes are formed,
   the upper hole region includes an internal upper hole region and an external upper hole region, the external upper hole region surrounding the internal upper hole region, and
   the upper holes include internal upper holes formed within the internal upper hole region and external upper holes formed within the external upper hole region.

7. The deposition apparatus as claimed in claim 6, wherein:
   the internal upper holes and the external upper holes have the same size, and
   a distance between the external upper holes is less than a distance between the internal upper holes.

8. The deposition apparatus as claimed in claim 6, wherein a diameter of each of the external upper holes is greater than a diameter of each of the internal upper holes.

9. The deposition apparatus as claimed in claim 6, wherein:
   the upper shower head includes an internal upper flow path connected to the internal upper holes and an external upper flow path connected to the external upper holes, and
   the external upper flow path is spaced apart from the internal upper flow path within the upper shower head.

10. The deposition apparatus as claimed in claim 9, further comprising:
    an internal flow controller connected to the internal upper flow path; and
    an external flow controller connected to the external upper flow path.

11. The deposition apparatus as claimed in claim 6, wherein an area of the external upper hole region is different from an area of the internal upper hole region.

12. The deposition apparatus as claimed in claim 1, further comprising a lower heater disposed within the lower shower head.

13. The deposition apparatus as claimed in claim 12, further comprising an upper heater disposed within the upper shower head.

* * * * *